United States Patent
Tohyama et al.

[11] Patent Number: 5,889,913
[45] Date of Patent: Mar. 30, 1999

[54] OPTICAL SEMICONDUCTOR DEVICE AND METHOD OF FABRICATING THE SAME

[75] Inventors: Masaki Tohyama, Saitama; Yuzo Hirayama, Yokohama, both of Japan

[73] Assignee: Kabushiki Kaisha Toshiba, Kawasaki, Japan

[21] Appl. No.: 614,649

[22] Filed: Mar. 13, 1996

[30] Foreign Application Priority Data

Mar. 15, 1995 [JP] Japan .................................. 7-055953

[51] Int. Cl.⁶ .................................................. G02B 6/10
[52] U.S. Cl. ................................................ 385/131; 385/2
[58] Field of Search ................................. 372/43, 44, 45, 372/46, 96, 50; 437/129, 5, 130, 155, 247; 385/2, 4, 9, 131, 130, 132

[56] References Cited

U.S. PATENT DOCUMENTS

| | | | |
|---|---|---|---|
| 4,644,551 | 2/1987 | Kawano et al. | 372/45 |
| 4,667,332 | 5/1987 | Mihashi et al. | 372/45 |
| 5,019,519 | 5/1991 | Tanaka et al. | 437/22 |
| 5,042,049 | 8/1991 | Ohtoshi et al. | 372/45 |
| 5,450,437 | 9/1995 | Shim et al. | 372/45 |

FOREIGN PATENT DOCUMENTS 5-160506  6/1993  Japan .

OTHER PUBLICATIONS

"DRF–LD/Modulator Integrated Light Source by Bandgap Energy Controlled Selective MOVPE", Electronics Letters, vol. 28, No. 2, T. Kato, et al.; pp. 153–154, Jan. 1992.

*Primary Examiner*—Akm E. Ullah
*Attorney, Agent, or Firm*—Oblon, Spivak, McClelland, Maier & Neustadt, P.C.

[57] ABSTRACT

This invention provides an optical semiconductor device including a semiconductor substrate having a mesa stripe in which at least an optical waveguide layer is formed, a major surface of the semiconductor substrate being a crystal plane, a semiconductor buried layer formed on the two side surfaces of the mesa stripe, and a stripe cladding layer formed on the mesa stripe region and the semiconductor buried layer and having a shape whose section is substantially trapezoidal and whose side surfaces are crystal planes.

5 Claims, 11 Drawing Sheets

OPTICAL SEMICONDUCTOR DEVICE AND METHOD OF FABRICATING THE SAME

BACKGROUND OF THE INVENTION

1. Field of the Invention

The present invention relates to a semiconductor device and, more particularly, to a semiconductor optical modulator capable of performing high-speed modulation by using an electrical signal, an optical semiconductor device usable as a semiconductor laser device, and a method of fabricating the same.

2. Description of the Related Art

Recently, research and development are being actively done to increase the capacity of a trunk optical communication system. In a direct modulation system in which a semiconductor laser serves as both an oscillator and a modulator, the light source can be constituted by a single element. Accordingly, it is possible to simplify the system and decrease the system cost. To obtain a high-speed modulating operation in a semiconductor laser, the relaxation oscillation frequency must be high. For this purpose, it is crucial to decrease the threshold value and increase the output and accordingly it is essential to reduce the leakage current, in addition to improving the laser medium itself, e.g., forming an active layer from a multiple quantum well structure. Furthermore, in a semiconductor laser which directly modulates light intensity by using an injected current, a small element parasitic capacitance also is required.

On the other hand, in an external modulator system by which long-distance optical transmission is possible because wavelength chirping is little, a field absorption type semiconductor optical modulator capable of being monolithically integrated with a semiconductor laser, as a light source, is being vigorously developed. The light absorption coefficient of this field absorption type semiconductor optical modulator is controlled by externally applying a voltage signal. To obtain a high extinction ratio, it is necessary to evenly apply an electric field to a light absorbing layer. Furthermore, to achieve large-capacity optical transmission, the element parasitic capacitance must be small enough to allow a high-speed modulating operation.

Figure 1:
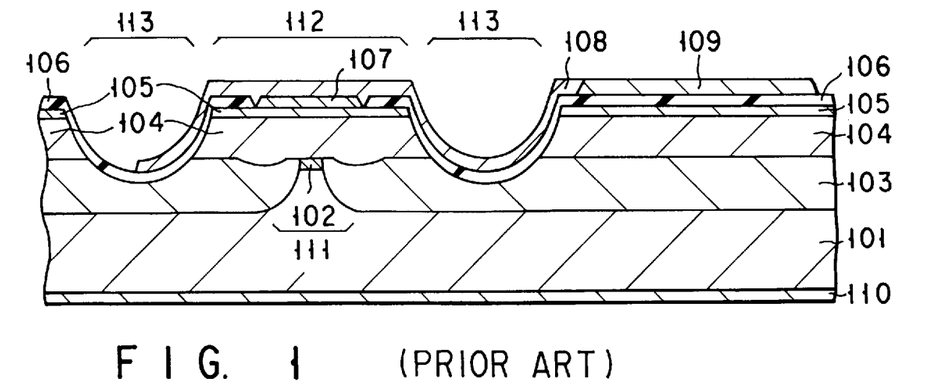
FIGS. 1 and 2 are sectional views in a plane perpendicular to the direction of propagation of semiconductor devices with conventional semiconductor buried structures.

In an optical semiconductor device with a conventional semiconductor buried structure used as a semiconductor laser and an optical modulator, the parasitic capacitance of an element formed by evenly burying it in a semiconductor substrate is reduced by processing vicinities around an optical waveguide stripe of the element into a narrow mesa shape. FIG. 1 is a sectional view in a plane perpendicular to the direction of wave propagation of an optical semiconductor device with a conventional semiconductor buried structure. In FIG. 1, reference numeral 101 denotes an n-type InP substrate; 102, an optical waveguide layer; 103, an Fe-doped semi-insulating InP buried layer; 104, a p-type InP cladding layer; 105, a p-type InGaAs contact layer; 106, an $SiO_2$ film; 107, a p-type Au/Zn/Au ohmic electrode; 108, a Ti/Pt/Au interconnecting line; 109, a Ti/Pt/Au bonding pad; and 110, an n-type AuGe/Ni/Au ohmic electrode.

This semiconductor device is fabricated as follows. A mesa stripe 111 including an active layer 102 is formed on an n-type InP substrate 101, and the two side surfaces of the mesa stripe 111 are buried with an Fe-doped semi-insulating InP layer 103. A p-type InP cladding layer 104 and a p-type InGaAs contact layer 105 are formed in this order on the mesa stripe region 111 and the Fe-doped semi-insulating InP layer 103. Thereafter, isolation trenches 113 are formed in regions on the two sides of the mesa stripe 111 by wet etching using a Br-based etchant.

In the optical semiconductor device with the structure illustrated in FIG. 1, to reduce the element parasitic capacitance it is necessary to process vicinities around the mesa stripe 111 into a narrow mesa shape and decrease the width of a mesa stripe 112 sandwiched between the isolation trenches 113. Unfortunately, since side etching necessarily occurs in the wet-etching process using a Br-based etchant, it is difficult to form the mesa stripe 112 with a controlled small width. Additionally, the flatness of the structure after the narrow mesa processing is low. This makes it difficult to form an electrode on the structure.

Figure 2:
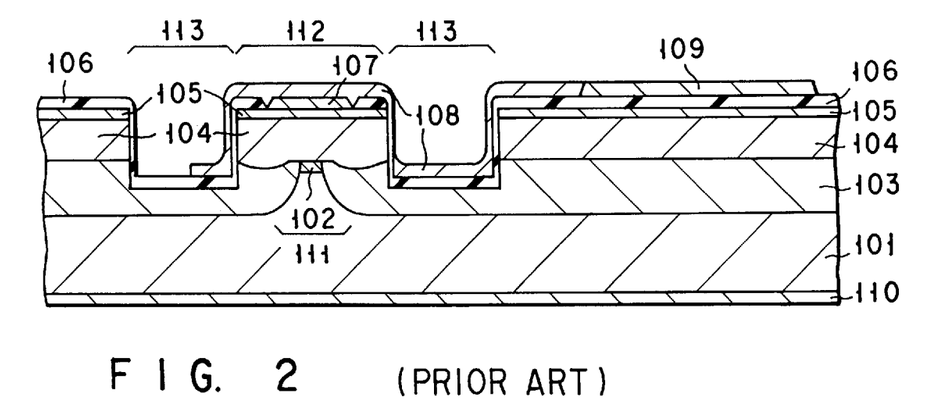

FIG. 2 shows a method by which the narrow mesa processing for an element is done by forming isolation trenches 113 by dry etching which causes no side etching. In this method the width of a mesa stripe 112 is readily controlled. However, the side surfaces of the isolation trenches 113 are nearly perpendicular to the substrate surface. Consequently, an electrode formation step is extremely difficult to perform after the narrow mesa processing. Even if the electrode formation is done, an interconnecting or wiring line 108 easily breaks particularly on the side surfaces of the isolation trenches 113. This results in the difficulty in step interconnection for connecting a p-type ohmic electrode 107 formed on the mesa stripe 112 and a bonding pad 109 formed outside the isolation trench 113.

SUMMARY OF THE INVENTION

The present invention has been made in consideration of the above situation and has as its object to provide an optical semiconductor device in which electrode formation can be performed with no breaking of an interconnecting line, which has a high-accuracy narrow mesa shape, and which can perform high-speed modulation, and a method of fabricating an optical semiconductor device in which the mesa width can be readily controlled and electrode formation can be easily performed.

The present invention provides an optical semiconductor device comprising a semiconductor substrate having a mesa stripe in which at least an optical waveguide layer is formed, a major surface of the semiconductor substrate being a crystal plane, a semiconductor buried layer formed on two side surfaces of the mesa stripe, and a stripe cladding layer formed on a mesa stripe region and the semiconductor buried layer and having a shape whose section is substantially trapezoidal and whose side surfaces are crystal planes.

The present invention also provides a method of fabricating an optical semiconductor device, comprising the steps of forming a mesa stripe in which at least an optical waveguide layer is formed on a semiconductor substrate whose major surface is a crystal plane, forming a semiconductor buried layer on two side surfaces of the mesa stripe, forming a growth inhibiting mask having a stripe opening including a region of the mesa stripe on the semiconductor buried layer, and performing selective growth by using the growth inhibiting mask, thereby forming a cladding layer having a shape whose section is substantially trapezoidal and whose side surfaces are crystal planes on the mesa stripe region and the semiconductor buried layer.

DETAILED DESCRIPTION OF THE PREFERRED EMBODIMENTS

In an optical semiconductor device of the present invention, the side surfaces of an optical waveguide layer are covered with a semiconductor layer having a current blocking effect. Therefore, when the optical semiconductor device is used as an optical modulator and a voltage is externally applied to the device, an electric field can be evenly applied in the stacking direction (the direction of thickness) to a light absorbing layer contained in the optical waveguide layer. This results in a high extinction ratio. On the other hand, when the optical semiconductor device is used as a semiconductor laser it is possible to sufficiently reduce the leakage current. Consequently, a low-threshold operation and a high-output operation can be performed.

Furthermore, a cladding layer is formed to have a shape whose section is substantially trapezoidal and whose side surfaces are (111) crystal planes. This cladding layer can be formed by selective growth, and its position and size can be arbitrarily determined by a selective growth inhibiting mask formed beforehand. That is, since the width of the cladding layer can be determined by the selective growth inhibiting mask pitch, its controllability is extremely high. Also, the side surfaces of the cladding layer are relatively gentle inclined surfaces defined by (111) crystal planes. This allows an easy electrode formation step.

In the present invention, an optical semiconductor device to be used as a semiconductor laser contains an active layer in an optical waveguide layer. The device can be used as a semiconductor laser by applying a forward bias between a p-type ohmic electrode and an n-type ohmic electrode. On the other hand, an optical semiconductor device to be used as an optical modulator contains a light absorbing layer in an optical waveguide layer. The device can be used as an optical modulator by applying a reverse bias between a p-type ohmic electrode and an n-type ohmic electrode.

Embodiments of the present invention will be described in detail below with reference to the accompanying drawings.

(First Embodiment)

Figure 3:
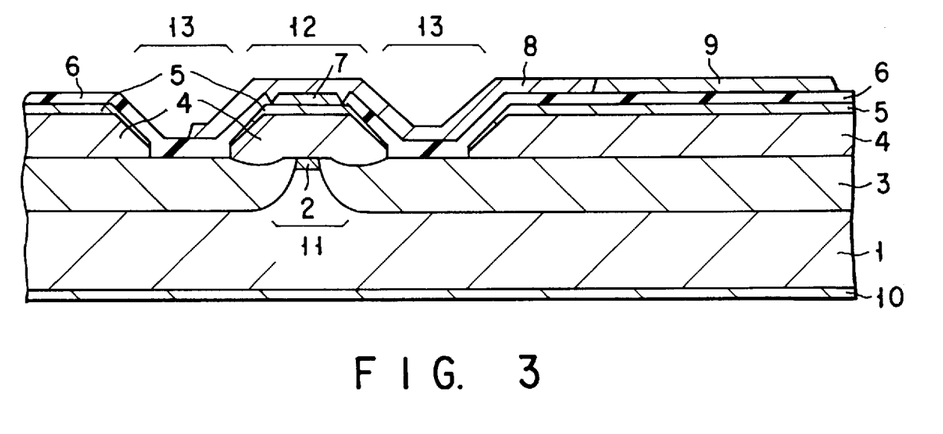
FIG. 3 is a sectional view in a plane perpendicular to the direction of propagation of an optical semiconductor device according to the first embodiment of the present invention.

FIG. 3 is a sectional view in a plane perpendicular to the direction of propagation of an optical semiconductor device according to the first embodiment of the present invention. In FIG. 3, reference numeral 1 denotes an n-type InP substrate whose major surface is a (100) crystal plane. On the surface of this n-type InP substrate 1, an optical waveguide layer 2 is formed and a mesa stripe 11 is formed by performing mesa processing. An Fe-doped semi-insulating InP buried layer 3 is formed on the side portions of the mesa stripe 11 so as to sandwich the mesa stripe 11. On the active layer 2 and the Fe-doped semi-insulating InP buried layer 3, a p-type InP cladding layer 4 whose sectional shape is substantially trapezoidal and whose side surfaces are (111) crystal planes is formed. A p-type InGaAs contact layer 5 is formed on this p-type InP cladding layer 4. A p-type Au/Zn/Au ohmic electrode 7 is formed on the p-type InGaAs contact layer 5 in a portion above the active layer 2. An SiO$_2$ film 6 is formed in a region except the p-type ohmic electrode 7. A Ti/Pt/Au interconnecting line 8 is formed on a region including the p-type ohmic electrode 7. A Ti/Pt/Au bonding pad 9 is formed on the SiO$_2$ film 6 so as to contact the interconnecting line 8. An n-type AuGe/Ni/Au ohmic electrode 10 is formed on the lower surface of the n-type InP substrate 1.

Figure 4A:
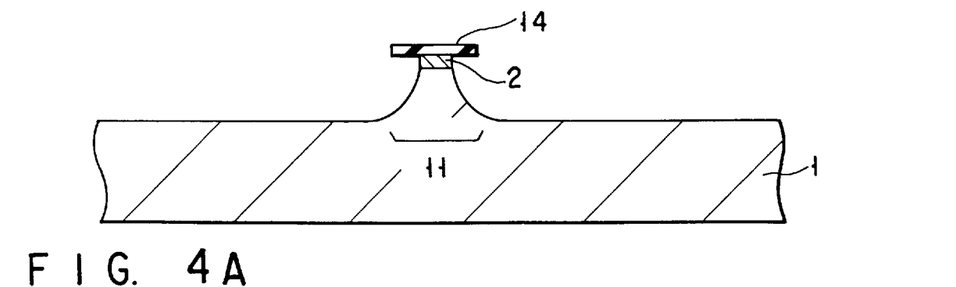
FIGS. 4A to 4D are sectional views in a plane perpendicular to the direction of propagation in the fabrication steps of the optical semiconductor device illustrated in FIG. 3.
Figure 4B:
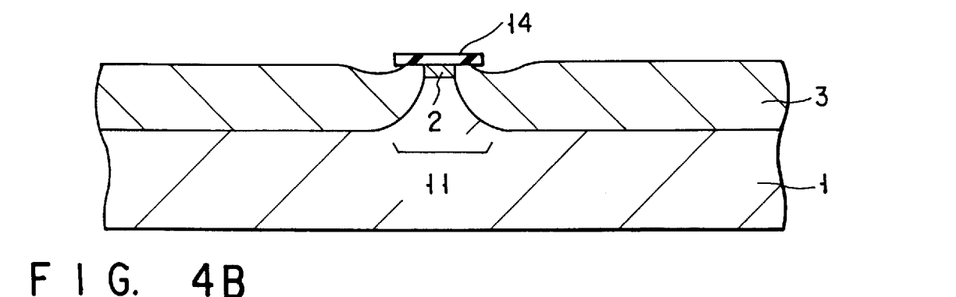
Figure 4C:
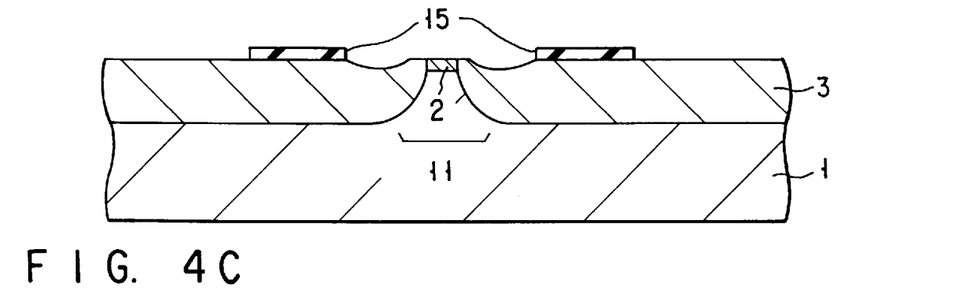
Figure 4D:
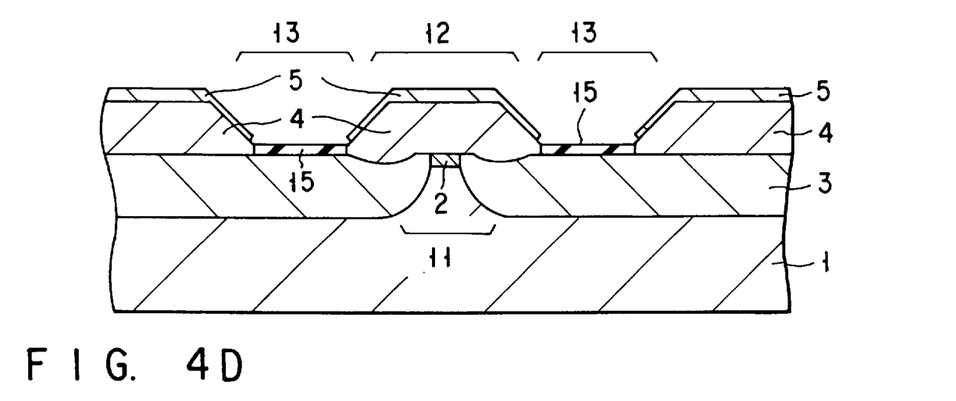

The fabrication steps of the optical semiconductor device shown in FIG. 3 will be described below with reference to FIGS. 4A to 4D. First, as illustrated in FIG. 4A, an optical waveguide layer 2 having an InGaAsP/InGaAsP multiple quantum well structure is formed on an n-type InP substrate 1 whose major surface is a (100) crystal plane. A 4-μm wide SiO$_2$ film 14 is formed into the shape of a stripe, and wet etching using an HBr—HCl etchant is performed by using this SiO$_2$ film 14 as a mask, thereby forming a mesa stripe 11 1.5 μm in width and 2 μm in height. In FIG. 4B, the two side portions of the mesa stripe 11 are buried by forming an Fe-doped semi-insulating InP layer 3 by metal organic chemical vapor deposition (MOCVD). In FIG. 4C, the SiO$_2$ film 14 is removed, and a pair of stripes of an SiO$_2$ film 15 are so formed as to sandwich the mesa stripe 11. The width of the stripes of the SiO$_2$ film 15 is 5 μm, and the spacing between them is 6 μm. In FIG. 4D, the SiO$_2$ film 15 is used as a selective growth inhibiting mask to selectively grow a p-type InP cladding layer 4 and a p-type InGaAs contact layer 5 in this order by MOCVD. An electrode formation step is then performed to complete the optical semiconductor device with the narrow mesa structure illustrated in FIG. 3.

In the optical semiconductor device having the structure shown in FIG. 3, the two side surfaces of the optical waveguide layer 2 are covered with the Fe-doped semi-insulating InP layer 3 with a current blocking effect. When this optical semiconductor device is used as an optical modulator, a reverse bias voltage is applied between the p-type ohmic electrode 7 and the n-type ohmic electrode 10. Consequently, an electric field can be evenly applied in the direction of stacking to the light absorbing layer contained in the optical waveguide layer 2, and a high extinction ratio can be obtained. On the other hand, when the optical semiconductor device is used as a semiconductor laser, the leakage current can be sufficiently reduced by applying a forward bias voltage between the p-type ohmic electrode 7 and the n-type ohmic electrode 10.

Also, the p-type InP cladding layer 4 and the p-type InGaAs contact layer 5 formed by selective growth are isolated into stripes by isolation trenches 13. Since the positions and sizes of the isolation trenches 13 are determined by the SiO$_2$ masks 15 previously formed, the p-type InP cladding layer 4 and the p-type InGaAs contact layer 5 can be grown in desired positions. Accordingly, the width of a mesa stripe 12 can be controlled to be small. In addition, the side surfaces of the p-type InP cladding layer 4 and the p-type InGaAs contact layer 5 formed by selective growth consist of (111) crystal planes. Consequently, high-quality surfaces with a low interface state density can be obtained. This makes it possible to reduce the leakage current on the side surfaces of the mesa stripe 12. Furthermore, the side surfaces of the p-type InP cladding layer 4 and the p-type InGaAs contact layer 5 are relatively gentle inclined surfaces defined by (111) crystal planes, and so the interconnecting line 8 is not disconnected in the isolation trenches 13. As a consequence, it is readily possible to form a step interconnection for connecting the p-type ohmic electrode 7 formed on the mesa stripe 12 and the bonding pad 9 formed outside the isolation trench 13.

In the electrode formation step, the p-type ohmic electrode 7, the interconnecting line 8, and the bonding pad 9 are patterned by bringing a glass mask into contact with the substrate surface. Since the region except the stripe isolation trenches 13 has an almost even flat surface, no excessive stress is applied on the mesa stripe 12 positioned on the upper surface of the active layer 2 during the patterning step. Accordingly, the electrode can be formed without giving any damage to the element. Moreover, the bonding pad 9 is nearly flush with the mesa stripe 12. Therefore, when an Au wire is bonded to the bonding pad 9, the bonding tool does not erroneously come in contact with the mesa stripe 12 to thereby damage the element.

In this embodiment, the two side surfaces of the mesa stripe 11 are buried with the Fe-doped semi-insulating InP layer 3. However, the side surfaces of the mesa stripe 11 can also be buried with a two-layered semiconductor layer formed by stacking an n-type InP layer on top of an Fe-doped semi-insulating InP layer.

(Second Embodiment)

Figure 5:
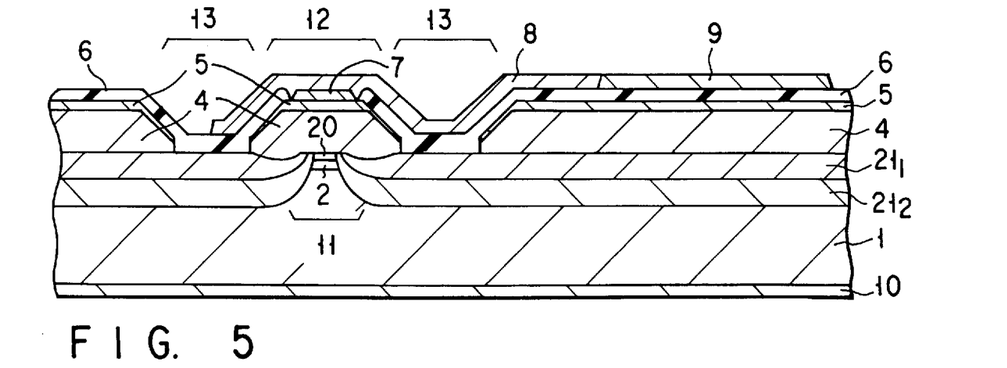
FIG. 5 is a sectional view in a plane perpendicular to the direction of propagation of an optical semiconductor device according to the second embodiment of the present invention.

The second embodiment of the present invention will be described below with reference to FIG. 5. FIG. 5 is a sectional view in a plane perpendicular to the direction of propagation of an optical semiconductor device according to the second embodiment of the present invention. The same reference numerals as in FIG. 3 denote the same parts in FIG. 5 and a detailed description thereof will be omitted.

In the optical semiconductor device illustrated in FIG. 5, an undoped InP layer 20 (cap layer) is formed on an optical waveguide layer 2. This undoped InP layer 20 prevents Zn as a p-type impurity from diffusing into the active layer 2 when a p-type InP cladding layer 4 is grown. Additionally, two n-type InP buried layers $21_1$ and $21_2$ are buried. The side surfaces of the optical waveguide layer 2 and the undoped InP layer 20 are buried with these two InP buried layers $21_1$ and $21_2$.

In this structure, the n-type InP buried layer need not have a two-layered structure. That is, the n-type InP buried layer can have an impurity concentration difference between its upper and lower portions in the direction of thickness, e.g., can have a concentration gradient in which the impurity concentration gradually changes in the direction of thickness.

In this element, a current blocking effect on the two sides of the optical waveguide layer 2 is obtained from a p-n junction consisting of the p-type InP cladding layer 4 and the n-type InP layer $21_1$. Therefore, it is necessary to narrow a mesa stripe 12 in order to reduce not only the element parasitic capacitance but also the leakage current. In the present invention, the p-type InP cladding layer 4 and a p-type InGaAs contact layer 5 can be formed by selective growth, and the positions and sizes of these layers can be determined by a selective growth inhibiting mask formed previously. Accordingly, the mesa stripe 12 can be formed with a controlled small width. Additionally, the impurity concentration of the n-type InP buried layer $21_1$ is $1\times10^{17}/cm^3$ which is lower than the impurity concentration ($1\times10^{18}/cm^3$) of the n-type InP buried layer $21_2$ and an n-type InP substrate. As a result, the width of a depletion layer in the p-n junction consisting of the p-type InP cladding layer 4 and the n-type InP layer $21_1$ can be increased. This reduces the parasitic capacitance per unit area.

Furthermore, since the impurity concentration of the n-type InP buried layer $21_1$ is low, Zn as a p-type impurity easily diffuses into the n-type InP buried layer $21_1$ when the p-type InP cladding layer 4 is grown. Therefore, an actual p-n junction is formed in a position deviated from the regrowth interface toward the substrate. The result is that a current blocking effect can be obtained at a position different from the regrowth interface in which the interface state density is high. This makes it possible to reduce the leakage current and obtain a low threshold value and a high output.

In this embodiment, the two side surfaces of a mesa stripe 11 are covered with the n-type InP layers $21_1$ and $21_2$ having different impurity concentrations. However, the impurity concentration of the n-type InP buried layer can also be gradually changed in the stacking direction (upward along the direction of thickness) or need not be changed.

(Third Embodiment)

Figure 6:
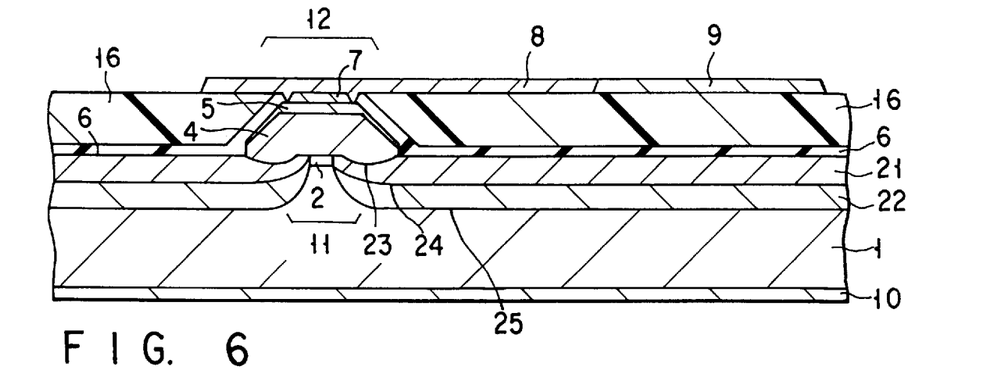
FIG. 6 is a sectional view in a plane perpendicular to the direction of propagation of an optical semiconductor device according to the third embodiment of the present invention.

The third embodiment of the present invention will be described below with reference to FIG. 6. FIG. 6 is a sectional view in a plane perpendicular to the direction of propagation of an optical semiconductor device according to the third embodiment of the present invention. The same reference numerals as in FIG. 3 denote the same parts in FIG. 6 and a detailed description thereof will be omitted.

In the optical semiconductor device shown in FIG. 6, a two-layered buried layer formed by sequentially forming a p-type InP buried layer 22 and an n-type InP buried layer 21 is buried on a region except a mesa stripe 11 on an n-type InP substrate 1. The two side surfaces of an optical waveguide layer 2 are buried with the p-type buried layer 22 and the n-type InP buried layer 21. Also, a polyimide film 16 for planarization is formed on an $SiO_2$ film 6, and an interconnecting line 8 and a bonding pad 9 are formed on the polyimide film 16.

In this element, a p-type InP cladding layer 4 and a p-type InGaAs contact layer 5 are selectively grown only in the region of a mesa stripe 12 by using a selective growth inhibiting mask having only one stripe opening. Since the side surfaces of the mesa stripe 12 are buried with the polyimide film 16, the electrode pad capacitance per unit area is reduced. The side surfaces of the p-type InP cladding layer 4 and the p-type InGaAs contact layer 5 are gentle inclined surfaces defined by (111) crystal planes. Consequently, it is readily possible to perform the step of planarizing the element surface by using the polyimide film 16.

In the present invention, the p-type InP cladding layer 4 and the p-type InGaAs contact layer 5 can be formed at given positions by selective growth. Therefore, the mesa stripe 12 can be formed with a controlled small width, and this reduces the depletion layer capacitance in a p-n junction 23 consisting of the p-type cladding layer 4 and the n-type InP buried layer 21. Furthermore, since the impurity concentration in the n-type InP buried layer 21 is as low as $1\times10^{17}/cm^3$, the width of the depletion layer can be increased in the p-n junction 23. Accordingly, the parasitic capacitance per unit area also can be reduced.

When this optical semiconductor device is used as a semiconductor laser, a forward bias voltage is applied between a p-type ohmic electrode 7 and an n-type ohmic electrode 10. As a consequence, a current blocking effect is obtained in a p-n junction 24 consisting of the n-type InP buried layer 21 and the p-type InP buried layer 22. Since the p-n junction 24 is not a regrowth interface, the leakage current can be sufficiently reduced. Accordingly, a low-threshold operation and a high-output operation can be obtained.

(Fourth Embodiment)

Figure 7:
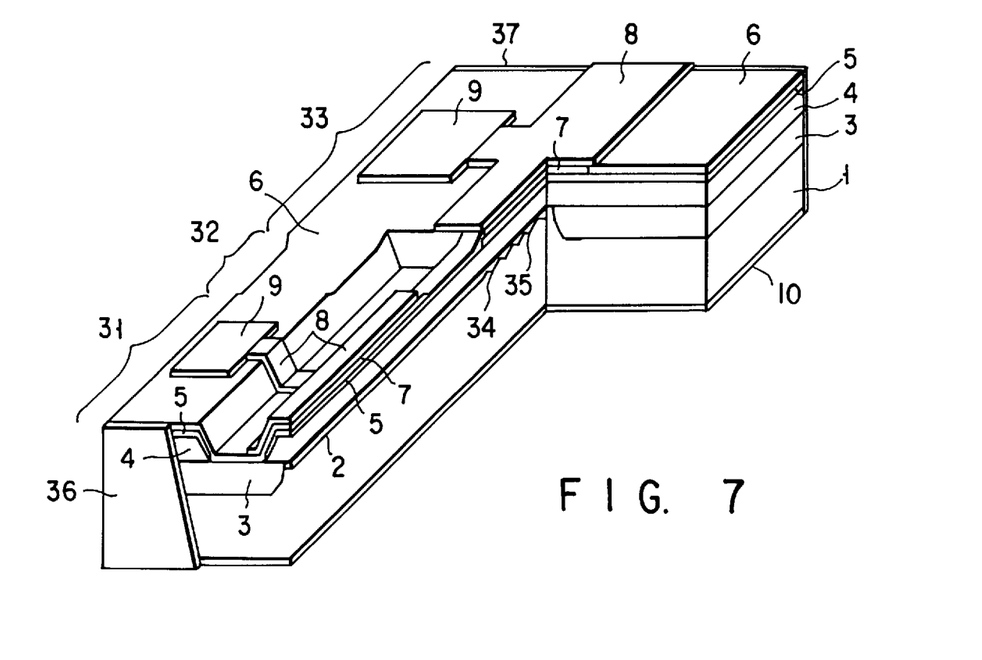
FIG. 7 is a perspective view showing an optical semiconductor device according to the fourth embodiment of the present invention.

The fourth embodiment of the present invention will be described below with reference to FIG. 7. FIG. 7 is a perspective view showing an optical semiconductor device according to the fourth embodiment of the present invention. This optical semiconductor device is fabricated by monolithically integrating an optical modulator 31 and a DFB laser 33. In FIG. 7, reference numeral 34 denotes an optical waveguide layer containing an active layer; and 35, a diffraction grating. A nonreflection coating is formed on the front end face of the element by using an $SiN_x$ film 36, and a high-reflection coating is formed on its rear end face by using an $Si/SiO_2$ multilayered film 37.

Figure 8:
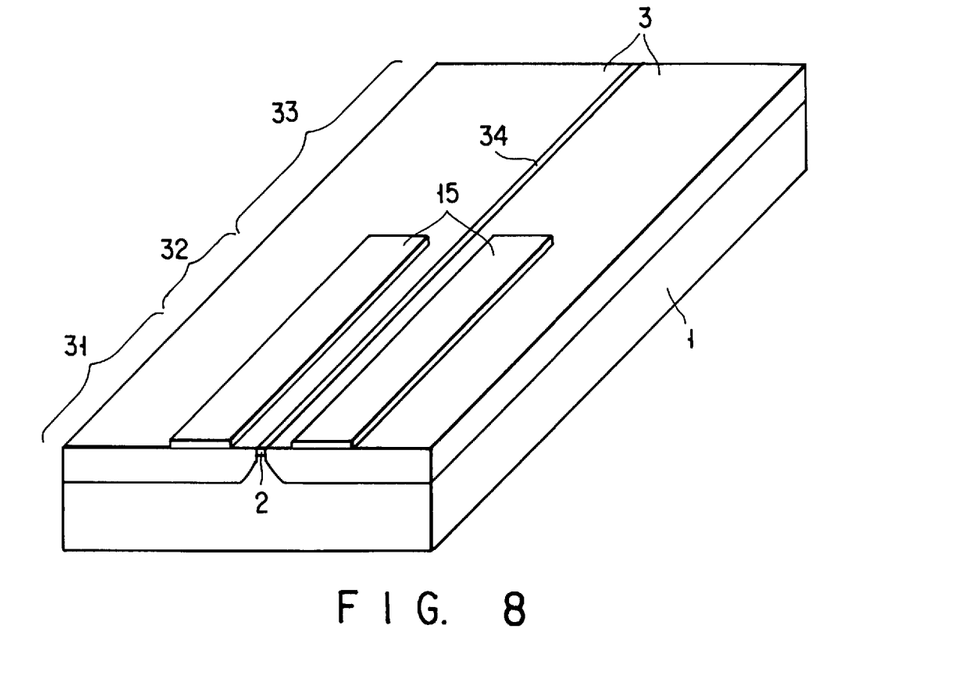
FIG. 8 is a perspective view showing an example of a selective growth inhibiting mask used in a method of fabricating the optical semiconductor device according to the fourth embodiment of the present invention.

In this element, a p-type InP cladding layer 4 and a p-type InGaAs contact layer 5 are formed by selective growth by using an $SiO_2$ mask 15, FIG. 8, as a selective growth inhibiting mask. As a result, in the optical modulator region 31 and an electrode isolation region 32, the p-type InP cladding layer 4 and the p-type InGaAs contact layer 5 are isolated by a stripe trench 13 having a shape whose section is substantially trapezoidal and whose side surfaces are (111) planes. In the laser region 33, the p-type InP cladding layer 4 and the p-type InGaAs contact layer 5 are evenly grown. This reduces the parasitic capacitance in the optical modulator region 31 and thereby allows a high-speed modulating operation. Furthermore, since the p-type InGaAs contact layer 5 is etched away from the electrode isolation region 32, the electrode isolation resistance between the optical modulator region 31 and the laser region 33 is as high as 20 kΩ or more.

In this embodiment, the p-type InP cladding layer 4 and the p-type InGaAs contact layer 5 are evenly grown in the laser region 33. However, these cladding and contact layers can also be formed into the shape of a stripe by selective growth even in the laser region 33.

(Fifth Embodiment)

To realize an optical semiconductor device capable of a high-speed modulating operation, it is necessary to reduce the parasitic resistance per unit area and process an optical waveguide layer stripe and its vicinities into a narrow mesa shape.

In the structure shown in FIG. 3, the Fe-doped semi-insulating InP buried layer 3 traps electrons but does not trap holes. Accordingly, when holes are injected from the p-type InP cladding layer 4 into the semi-insulating InP buried layer 3, the injected holes recombine with the trapped electrons to allow a leakage current to flow. In particular, Fe as the dopant of the semi-insulating InP buried layer 3 and Z as the dopant of the p-type InP cladding layer 4 readily interdiffuse. Consequently, holes are easily injected from the p-type InP cladding layer 4 into the semi-insulating InP buried layer 3, and this sometimes increases the leakage current. Furthermore, when Zn as the dopant of the InP cladding layer 4 diffuses into the semi-insulating InP buried layer 3, the semi-insulating InP buried layer 3 becomes difficult to deplete. This increases the parasitic capacitance per unit area in some cases.

To reduce this leakage current, it is effective to form an n-type semiconductor layer, e.g., an n-type InP current blocking layer, between the semi-insulating InP buried layer 3 and the InP cladding layer 4. This n-type InP current blocking layer functions as a barrier against holes and thereby prevents injection of holes from the p-type InP cladding layer 4 into the semi-insulating InP buried layer 3. At the same time, the n-type InP current blocking layer prevents interdiffusion of Fe as the dopant of the semi-insulating InP buried layer 3 and Zn as the dopant of the p-type InP cladding layer 4. As a consequence, the leakage current can be sufficiently reduced without increasing the parasitic capacitance per unit area. However, the n-type InP current blocking layer is not usually formed into a narrow mesa shape, and so the electric field applied to the Fe-doped semi-insulating InP buried layer 3 is distributed more widely than the width of the mesa stripe via the n-type InP current blocking layer. This poses the problem that the element parasitic capacitance increases although the p-type InP cladding layer 4 assumes a narrow mesa shape.

Each of the fifth to tenth embodiments, therefore, realizes a high-accuracy narrow mesa structure in which the parasitic capacitance per unit area is reduced and the applied electric field does not spread, thereby providing an optical semiconductor device capable of reducing the element parasitic capacitance and performing a high-speed modulating operation by using an electrical signal. That is, the gist of these embodiments is to provide a narrow mesa structure optical semiconductor device with a very small element parasitic capacitance in which a cladding layer is formed into a narrow mesa shape whose side surfaces are (111) crystal planes, and a stripe current blocking layer is formed between a semi-insulating semiconductor layer and the cladding layer.

Figure 9:
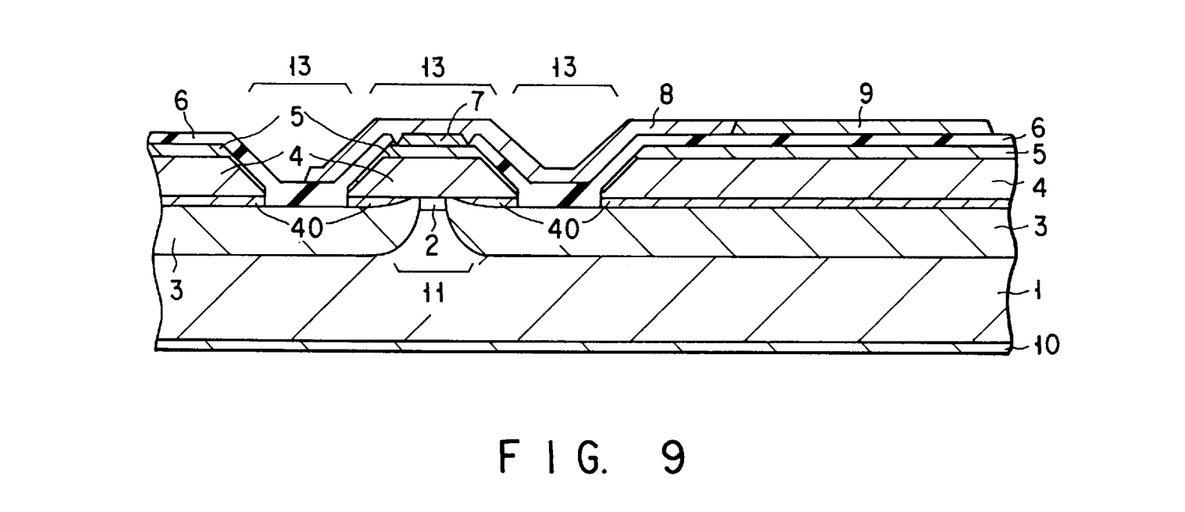
FIG. 9 is a sectional view in a plane perpendicular to the direction of propagation of an optical semiconductor device according to the fifth embodiment of the present invention.

The fifth embodiment of the present invention will be described below with reference to FIG. 9. FIG. 9 is a sectional view in a plane perpendicular to the direction of propagation of an optical semiconductor device according to the fifth embodiment of the present invention. The same reference numerals as in FIG. 3 denote the same parts in FIG. 9 and a detailed description thereof will be omitted.

In the optical semiconductor device illustrated in FIG. 9, an n-type InP current blocking layer 40 is formed between an Fe-doped semi-insulating InP buried layer 3 and a p-type InP cladding layer 4. This n-type InP current blocking layer 40 is divided into stripes by an $SiO_2$ film 6.

Figure 10A:
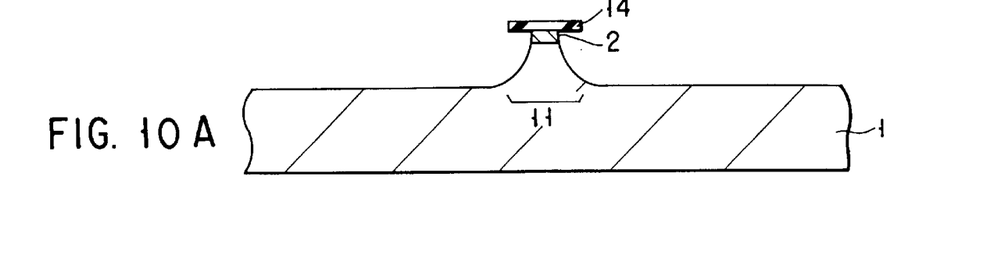
FIGS. 10A to 10E are sectional views in a plane perpendicular to the direction of propagation in the fabrication steps of the optical semiconductor device illustrated in FIG. 9.
Figure 10B:
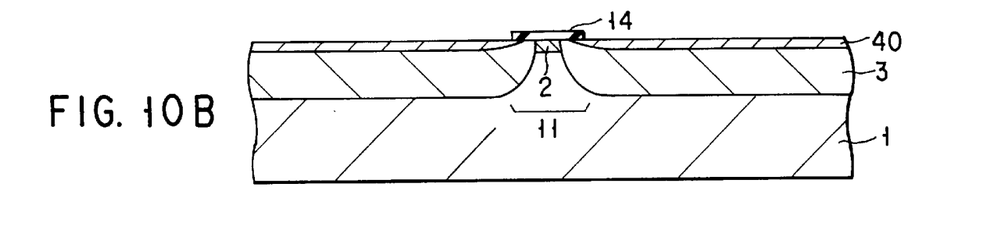
Figure 10C:
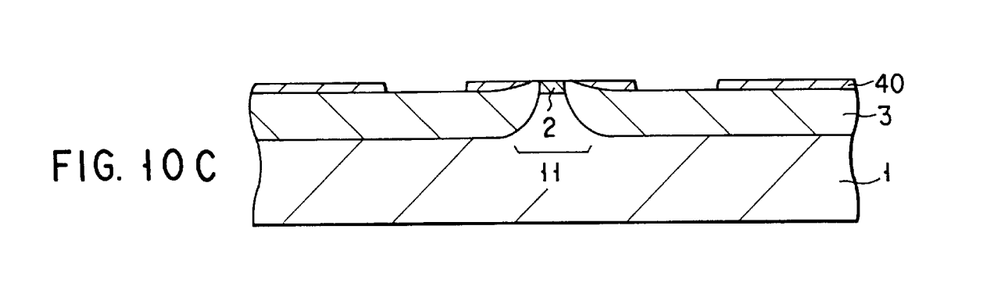

The fabrication steps of the optical semiconductor device in FIG. 9 will be described below with reference to FIGS. 10A to 10E. First, as illustrated in FIG. 10A, an optical waveguide layer 2 having an InGaAsP/InGaAs multiple quantum well structure is formed on an n-type InP substrate 1 whose major surface is a (100) crystal plane. A 4-$\mu$m wide $SiO_2$ film 14 is formed into the shape of a stripe, and wet etching using a Br-based etchant is performed by using this $SiO_2$ film 14 as a mask, thereby forming a mesa stripe 11 1 $\mu$m in width and 2 $\mu$m in height. In FIG. 10B, the two side portions of the mesa stripe 11 are buried with a 1.8-$\mu$m thick Fe-doped semi-insulating InP layer 3 and a 0.3-$\mu$m thick n-type InP current blocking layer 40 formed by MOCVD. In FIG. 10C, the $SiO_2$ film 14 is removed, and the n-type InP current blocking layer 40 on the Fe-doped semi-insulating InP layer 3 is partially etched away. Consequently, the n-type InP current blocking layer 40 is processed into a pair of stripes on the two sides of the optical waveguide layer 2.

Figure 10D:
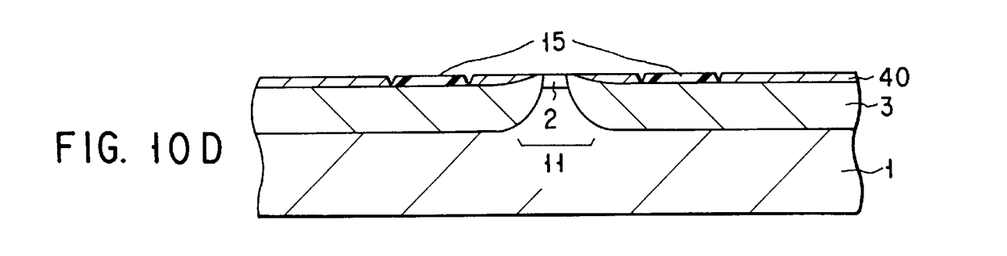
Figure 10E:
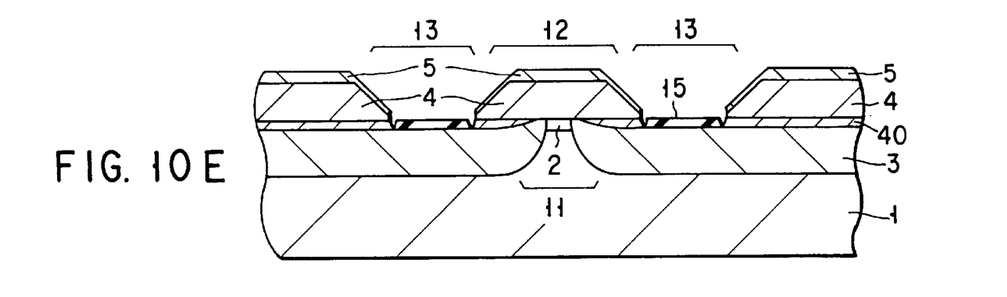

Furthermore, as shown in FIG. 10D, a pair of stripes of an $SiO_2$ film 15 are formed on the regions from which the n-type InP current blocking layer 40 is removed. The width of the stripes of the $SiO_2$ film 15 is 5 $\mu$m, and the spacing between them is 6 $\mu$m. In FIG. 10E, a p-type InP cladding layer 4 and a p-type InGaAs contact layer 5 are selectively grown in this order by MOCVD by using the $SiO_2$ film 15 as a selective growth inhibiting mask. Finally, an electrode formation step is performed to complete the optical semiconductor device with a narrow mesa structure illustrated in FIG. 9.

In the method of this embodiment, the step of processing the n-type InP current blocking layer 40 into a stripe and the step of forming the stripe $SiO_2$ mask 15 can be performed by patterning on an almost flat substrate surface. This makes high-accuracy patterning feasible. Additionally, the positions and sizes of the p-type InP cladding layer 4 and the p-type InGaAs contact layer 5 formed by selective growth can be arbitrarily determined by the $SiO_2$ growth inhibiting mask 15 formed previously. Accordingly, it is simultaneously possible to form a mesa stripe 12 with a controlled small width and accurately form the stripe n-type InP current blocking layer 40 below the mesa stripe 12.

Also, since the two side surfaces of the mesa stripe 11 containing the optical waveguide layer 2 are buried with the Fe-doped semi-insulating InP layer 3, the parasitic capacitance per unit area can be sufficiently reduced. The n-type InP current blocking layer 40 prevents interdiffusion of Fe as the dopant of the semi-insulating InP buried layer 3 and Zn as the dopant of the p-type InP cladding layer 4. Consequently, the leakage current can be reduced without increasing the parasitic capacitance per unit area. Furthermore, since the n-type InP current blocking layer 40 is formed into stripes below the mesa stripe 12, the electric field applied to the semi-insulating InP buried layer 3 is not distributed more widely than the width of the mesa stripe 12. The result is an extremely small element parasitic capacitance.

(Sixth Embodiment)

The sixth embodiment of the present invention will be described below with reference to FIGS. 11A to 11E. FIGS. 11A to 11E are sectional views in a plane perpendicular to the direction of propagation in the individual fabrication steps of an optical semiconductor device according to the sixth embodiment of the present invention. The same reference numerals as in FIG. 3 denote the same parts in FIGS. 11A to 11E and a detailed description thereof will be omitted.

Figure 11A:
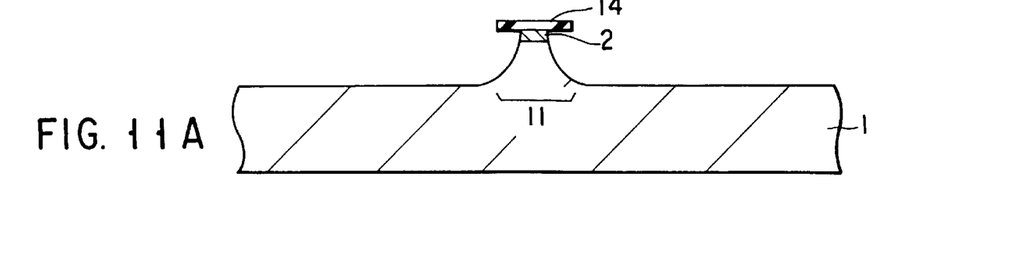
FIGS. 11A to 11E are sectional views in a plane perpendicular to the direction of propagation in the fabrication steps of an optical semiconductor device according to the sixth embodiment of the present invention.
Figure 11B:
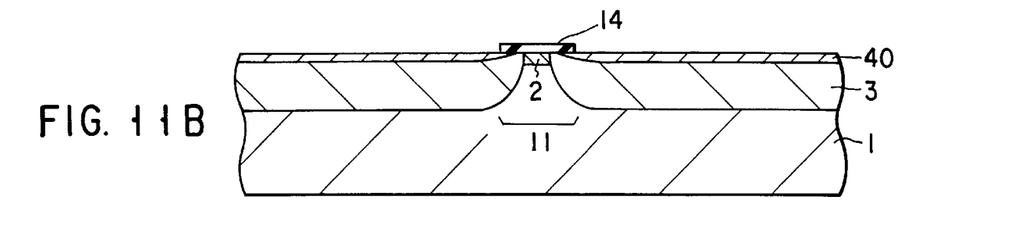
Figure 11C:
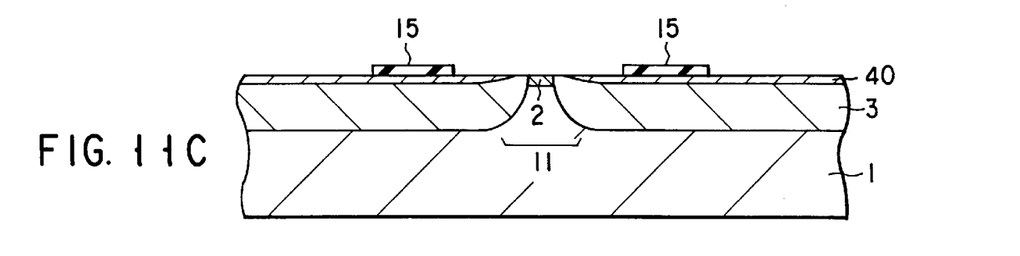

First, as illustrated in FIG. 11A, a mesa stripe 11 on top of which an optical waveguide layer 2 is stacked is formed on an n-type InP substrate 1 whose major surface is a (100) crystal plane. In FIG. 11B, the two side portions of the mesa stripe 11 are buried with an Fe-doped semi-insulating InP layer 3 and an n-type InP current blocking layer 40 formed by MOCVD. In FIG. 11C, an $SiO_2$ mask 14 is removed, and a pair of stripes of an $SiO_2$ film 15 are formed on the n-type InP current blocking layer 40 so as to sandwich the mesa stripe 11.

Figure 11D:
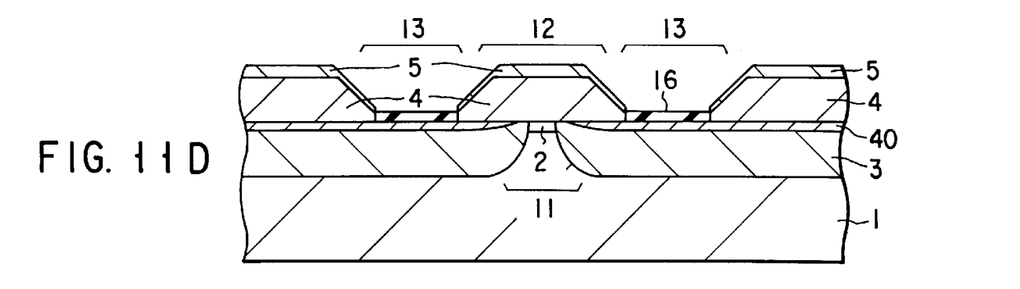
Figure 11E:
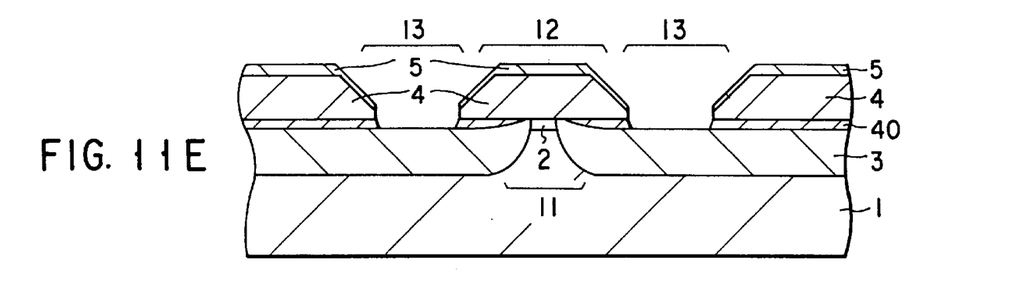

Subsequently, as illustrated in FIG. 11D, a p-type InP cladding layer 4 and a p-type InGaAs contact layer 5 are selectively grown in this order by MOCVD by using the $SiO_2$ film 15 as a selective growth inhibiting mask. In FIG. 11E, portions of the n-type InP current blocking layer 40 below the $SiO_2$ growth inhibiting mask 15 are etched away. Finally, an electrode formation step is performed to complete a narrow mesa structure optical semiconductor device having a structure similar to that shown in FIG. 9.

Figure 12A:
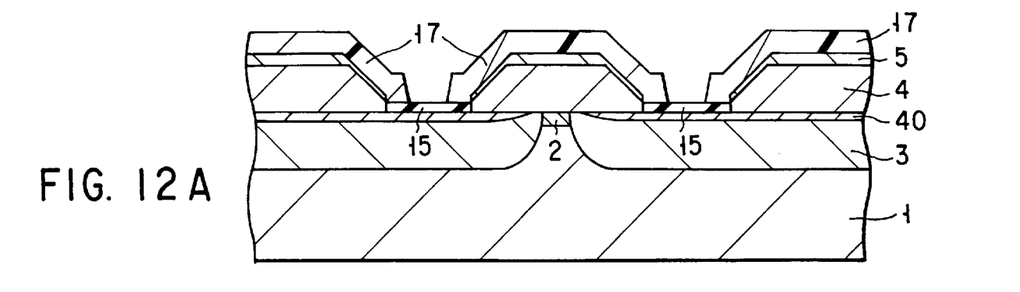
FIGS. 12A to 12C are sectional views in a plane perpendicular to the direction of propagation in the fabrication steps of the optical semiconductor device according to the sixth embodiment of the present invention.
Figure 12B:
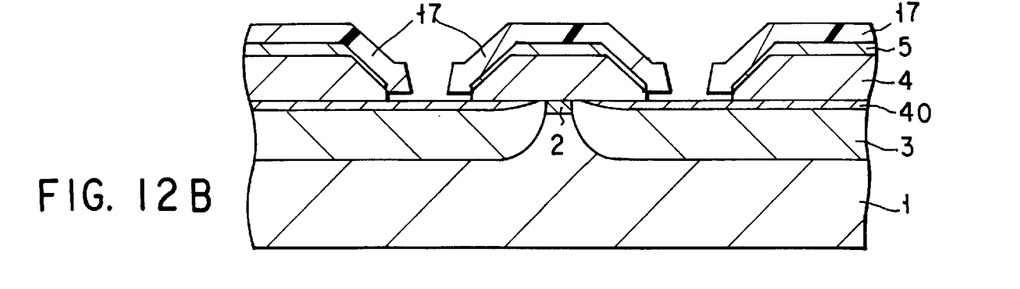
Figure 12C:
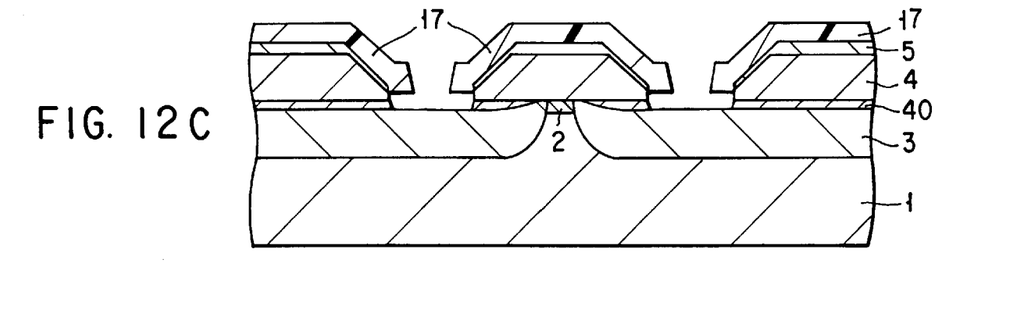

In this embodiment, the step of processing the n-type InP current blocking layer 40 into a stripe can be performed in self-alignment as illustrated in FIGS. 12A to 12C. That is, as in FIG. 12A, the p-type InP cladding layer 4 and the p-type InGaAs contact layer 5 are selectively grown, and a resist layer 17 having openings is formed on the $SiO_2$ growth inhibiting mask 15. In FIG. 12B, the $SiO_2$ growth inhibiting mask 15 is etched away by using side etching. Consequently, portions of the n-type InP current blocking layer 40 below the $SiO_2$ growth inhibiting mask 15 are exposed. As shown in FIG. 12C, therefore, these exposed portions of the n-type InP current blocking layer 40 are removed by etching. As a consequence, it is possible to accurately form a stripe of the n-type InP current blocking layer 40 below a mesa stripe 12.

(Seventh Embodiment)

The seventh embodiment of the present invention will be described below with reference to FIGS. 13A to 13F. FIGS. 13A to 13F are sectional views in a plane perpendicular to the direction of propagation in the individual fabrication steps of an optical semiconductor device according to the seventh embodiment of the present invention. The same reference numerals as in FIG. 3 denote the same parts in FIGS. 13A to 13F and a detailed description thereof will be omitted.

Figure 13A:
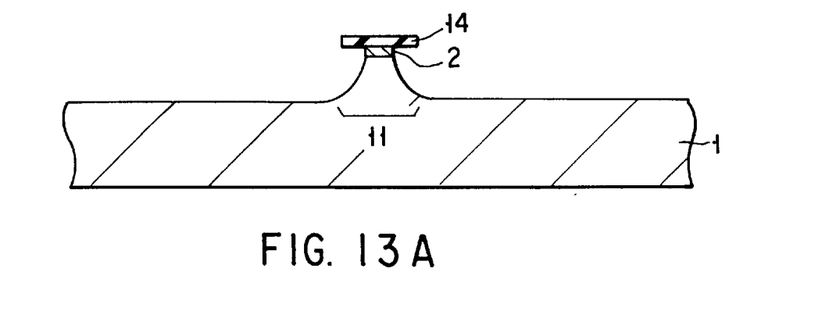
FIGS. 13A to 13F are sectional views in a plane perpendicular to the direction of propagation in the fabrication steps of an optical semiconductor device according to the seventh embodiment of the present invention.
Figure 13B:
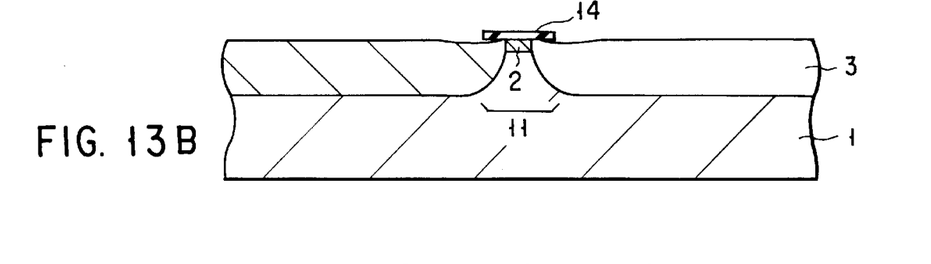
Figure 13C:
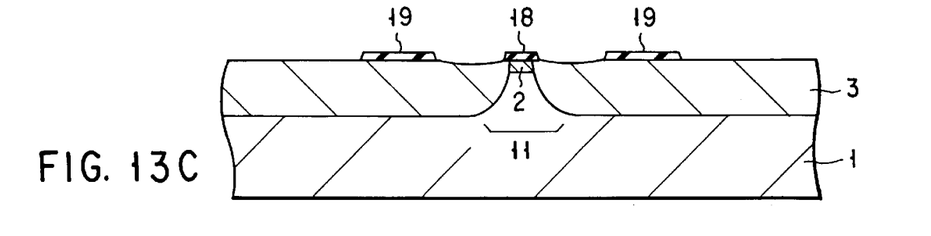

First, as illustrated in FIG. 13A, a mesa stripe 11 on which an optical waveguide layer 2 is stacked is formed on an n-type InP substrate 1 whose major surface is a (100) crystal plane. In FIG. 13B, the two side portions of the mesa stripe 11 are buried with an Fe-doped semi-insulating InP layer 3 formed by MOCVD. In FIG. 13C, after an $SiO_2$ mask 14 is removed, an $SiO_2$ film 18 is formed on the mesa stripe 11, and a pair of stripes of an $SiO_2$ film 19 are formed on the Fe-doped semi-insulating InP layer 3 so as to sandwich the mesa stripe 11.

Figure 13D:
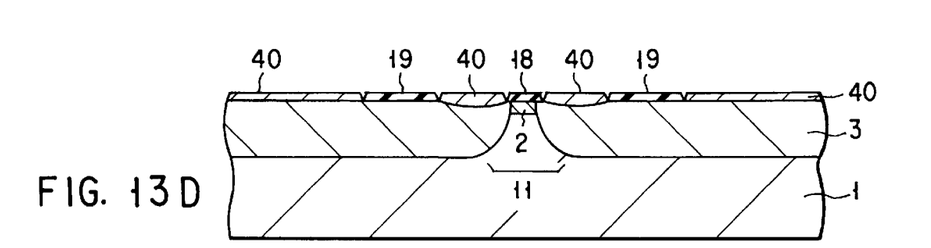
Figure 13E:
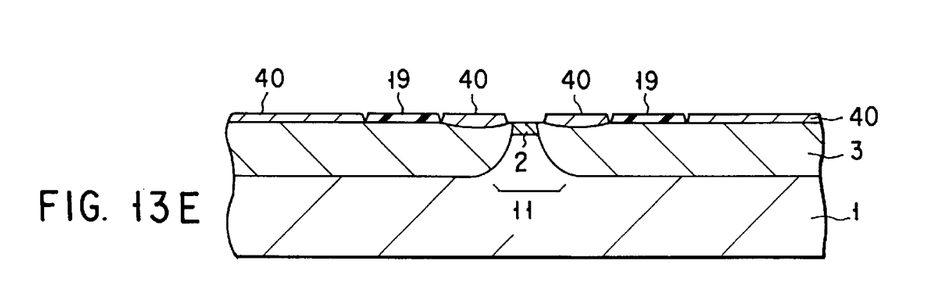
Figure 13F:
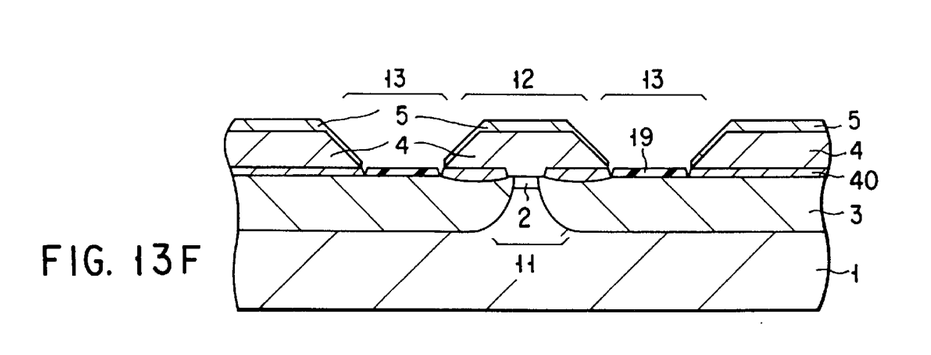

Subsequently, as illustrated in FIG. 13D, an n-type InP current blocking layer 40 is selectively grown by MOCVD by using the SiO$_2$ films 18 and 19 as selective growth inhibiting masks. In FIG. 13E, the SiO$_2$ film 18 on the mesa stripe 11 is etched away. In FIG. 13F, a p-type InP cladding layer 4 and a p-type InGaAs contact layer 5 are selectively grown by MOCVD by using the SiO$_2$ film 19 as a selective growth inhibiting mask. Finally, an electrode formation step is performed to complete a narrow mesa structure optical semiconductor device having a structure analogous to that shown in FIG. 9.

In this embodiment, the SiO$_2$ film 19 is used as a common growth inhibiting mask in the selective growth of the n-type InP current blocking layer 40 and the selective growth of the p-type InP cladding layer 4 and the p-type InGaAs contact layer 5. Accordingly, the n-type InP current blocking layer 40 can be formed into a stripe having the same width as the width of a mesa stripe 12.

(Eighth Embodiment)

Figure 14:
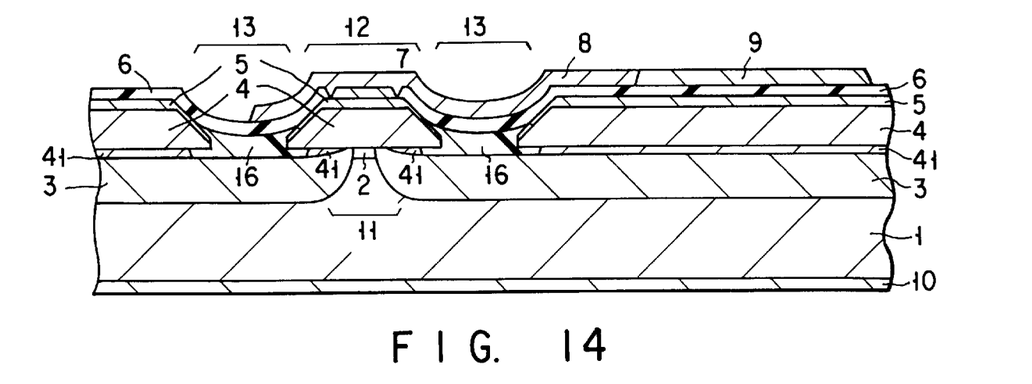
FIG. 14 is a sectional view in a plane perpendicular to the direction of propagation of an optical semiconductor device according to the eighth embodiment of the present invention.

The eighth embodiment of the present invention will be described below with reference to FIG. 14. FIG. 14 is a sectional view in a plane perpendicular to the direction of propagation of an optical semiconductor device according to the eighth embodiment of the present invention. The same reference numerals as in FIG. 9 denote the same parts in FIG. 14 and a detailed description thereof will be omitted.

In this embodiment, the two side portions of a mesa stripe 11 including an optical waveguide layer 2 are buried with an Fe-doped semi-insulating InP layer 3 and an n-type InGaAsP current blocking layer 41, a p-type InP cladding layer 4 and a p-type InGaAs contact layer 5 are selectively grown, and then the n-type InGaAsP current blocking layer 41 is processed into the shape of a stripe by etching. In this processing, as illustrated in FIG. 14, it is possible by using side etching to process the stripe of the n-type InGaAsP current blocking layer 41 to have a width smaller than the width of a mesa stripe 12. Also, a polyimide film 16 is buried in a region from which the n-type InGaAsP current blocking layer 41 is etched away. As a consequence, the distribution of an electric field applied to the semi-insulating InP buried layer 3 spreads only to the extent equivalent to the width of the n-type InGaAsP current blocking layer 41. This results in an extremely small element parasitic capacitance.

(Ninth Embodiment)

Figure 15:
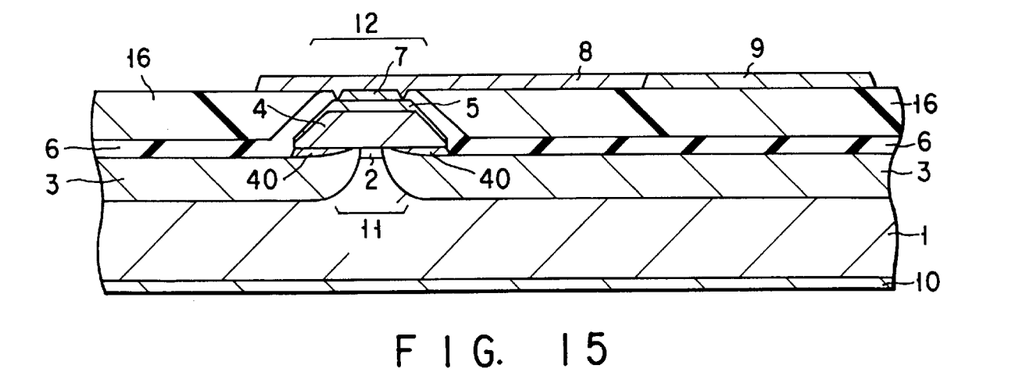
FIG. 15 is a sectional view in a plane perpendicular to the direction of propagation of an optical semiconductor device according to the ninth embodiment of the present invention.

The ninth embodiment of the present invention will be described below with reference to FIG. 15. FIG. 15 is a sectional view in a plane perpendicular to the direction of propagation of an optical semiconductor device according to the ninth embodiment of the present invention. The same reference numerals as in FIG. 9 denote the same parts in FIG. 15 and a detailed description thereof will be omitted.

In this embodiment, an n-type InP current blocking layer 40, a p-type cladding layer 4, and a p-type InGaAs contact layer 5 are formed only in the region of a mesa stripe 12, and the side surfaces of the mesa stripe 12 are buried with a polyimide film 16. As a result, the polyimide film 16, an SiO$_2$ film 6, and a semi-insulating InP buried layer 3 are stacked below a bonding pad (electrode pad) 9, reducing the electrode pad capacitance per unit area. Also, the side surfaces of the mesa stripe 12 are relatively gentle inclined surfaces defined by (111) crystal planes. This facilitates the step of planarizing the element surface by using the polyimide film 16.

(Tenth Embodiment)

Figure 16:
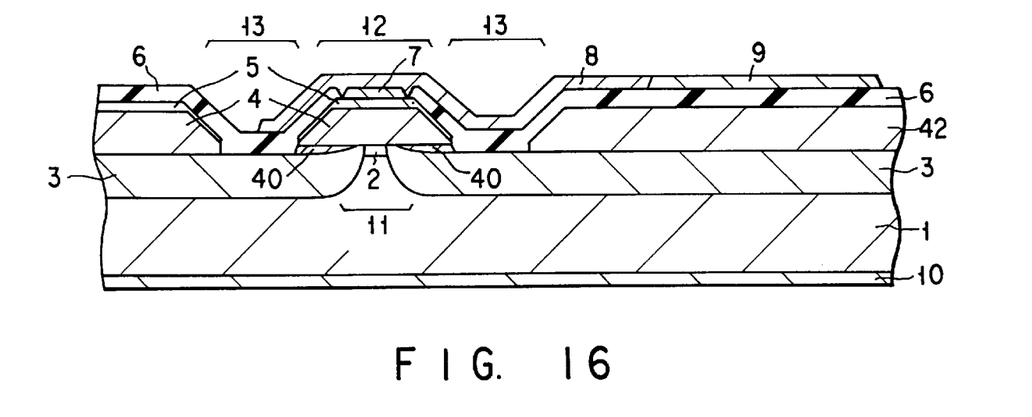
FIG. 16 is a sectional view in a plane perpendicular to the direction of propagation of an optical semiconductor device according to the tenth embodiment of the present invention.

The tenth embodiment of the present invention will be described below with reference to FIG. 16. FIG. 16 is a sectional view in a plane perpendicular to the direction of propagation of an optical semiconductor device according to the tenth embodiment of the present invention. The same reference numerals as in FIG. 9 denote the same parts in FIG. 16 and a detailed description thereof will be omitted.

In this embodiment, an n-type InP current blocking layer 40 is not formed below a bonding pad 9. Also, after a p-type InP cladding layer 4 and a p-type InGaAs contact layer 5 are selectively grown, the p-type InGaAs contact layer 5 below the bonding pad 9 is etched away, and the p-type InP cladding layer 4 is made semi-insulating by implantation of protons. Consequently, an SiO$_2$ film 6, a proton-implanted semi-insulating InP layer 42, and a semi-insulating InP buried layer 3 are stacked below the bonding pad 9. This reduces the electrode pad capacitance per unit area.

(Eleventh Embodiment)

To reduce the element parasitic capacitance in a narrow mesa structure optical semiconductor device, the width of the mesa stripe must be decreased. If this width is decreased, however, the area of a p-type ohmic electrode formed on a p-type InGaAs contact layer is decreased, and this increases the element series resistance. Accordingly, in a mesa stripe structure optical semiconductor device it is difficult to simultaneously reduce the parasitic capacitance and the series resistance.

Additionally, in a mesa stripe formation step, a mask is patterned in accordance with the position of an optical waveguide layer. Therefore, a higher mask alignment accuracy is required as the width of a mesa stripe is decreased. This makes it difficult to control the mesa stripe width to be small and decrease the fabrication cost.

Furthermore, since the surface after the mesa stripe is formed lacks flatness, it is difficult to form an electrode on the surface. In particular, an interconnecting line formed on the side surfaces of the mesa stripe readily breaks. The result is the difficulty of forming a step interconnection for connecting a p-type ohmic electrode to a bonding pad.

Accordingly, the eleventh and twelfth embodiments of the present invention provide optical semiconductor devices capable of simultaneously reducing the parasitic capacitance and the series resistance and performing a high-speed modulating operation by using an electrical signal, and provide optical semiconductor device fabrication methods capable of fabricating such optical semiconductor devices at a low cost and also facilitating electrode formation.

Figure 17:
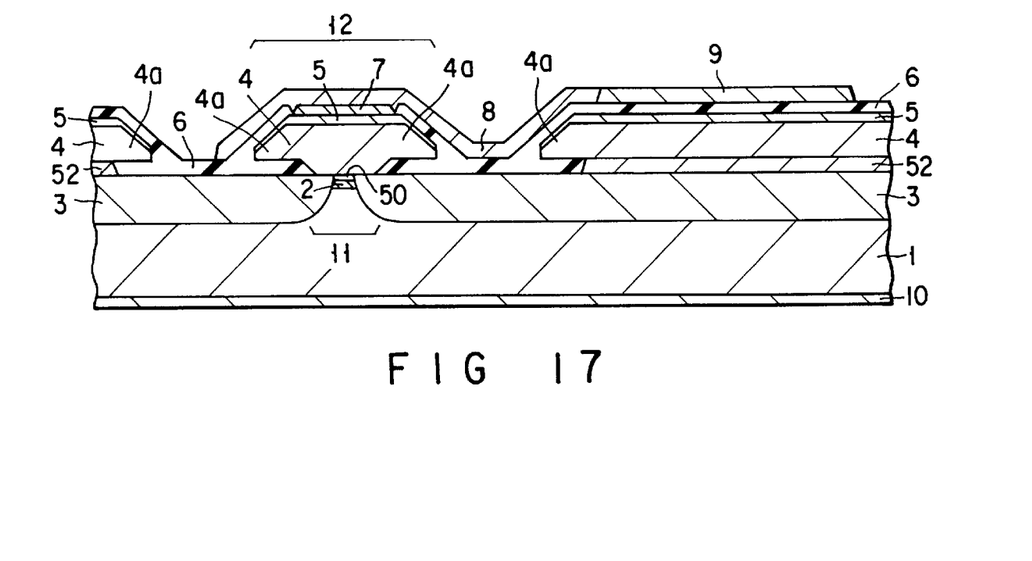
FIG. 17 is a sectional view in a plane perpendicular to the direction of propagation of an optical semiconductor device according to the eleventh embodiment of the present invention.

The eleventh embodiment of the present invention will be described below with reference to FIG. 17. FIG. 17 is a sectional view in a plane perpendicular to the direction of propagation of an optical semiconductor device according to the eleventh embodiment of the present invention. The same reference numerals as in FIG. 3 denote the same parts in FIG. 17 and a detailed description thereof will be omitted.

In the optical semiconductor device shown in FIG. 17, an InP cap layer 50 is formed on an optical waveguide layer 2 in a mesa stripe. Accordingly, an Fe-doped semi-insulating InP layer 3 is buried in the two side portions of both the optical waveguide layer 2 and the InP cap layer 50.

Also, overhangs 4a are formed in a p-type InP cladding layer 4. An SiO$_2$ film 6 extends below these overhangs 4a of the p-type InP cladding layer 4. An InGaAsP spacer layer 52 is formed below the p-type InP cladding layer 4 in a region except a mesa stripe 12.

Figure 18A:
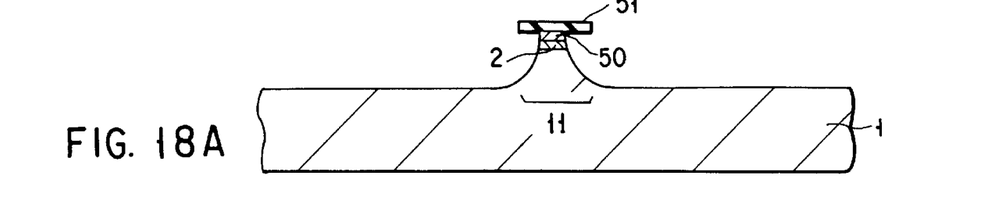
FIGS. 18A to 18E are sectional views in a plane perpendicular to the direction of propagation in the fabrication steps of the optical semiconductor device illustrated in FIG. 17.

The fabrication steps of the optical semiconductor device shown in FIG. 17 will be described below with reference to FIGS. 18A to 18E. First, as illustrated in FIG. 18A, an optical waveguide layer 2 and an InP cap layer 50 are stacked on an n-type InP substrate 1 whose major surface is a (100) crystal plane, and a 4-µm wide SiO$_2$ film 51 is formed into a stripe. This SiO$_2$ film 51 is used as a mask to etch the InP cap layer 50, the optical waveguide layer 2, and the n-type InP substrate 1, forming a mesa stripe 11 1 μm in width and 2 μm in height.

Figure 18B:
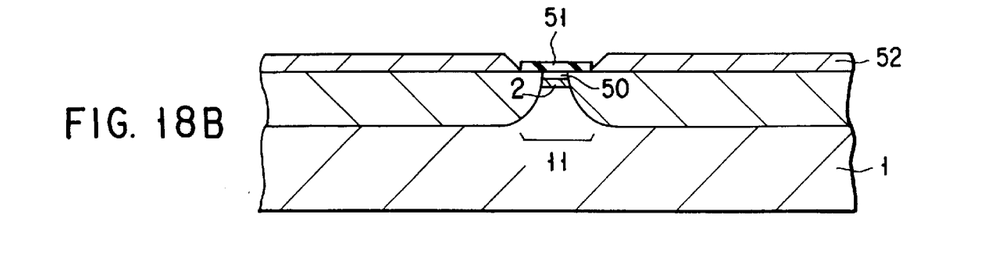
Figure 18C:
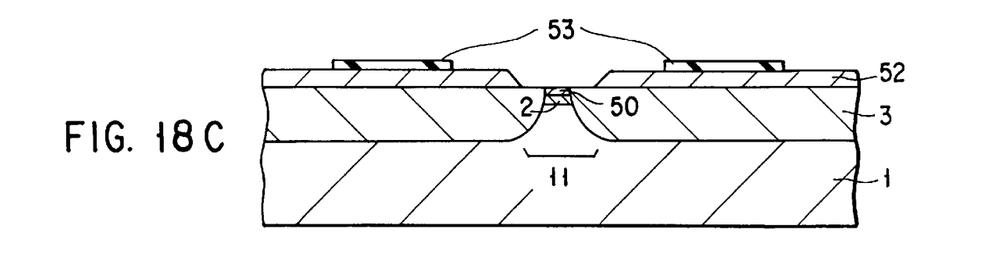

As illustrated in FIG. 18B, the two side portions of the mesa stripe 11 are buried with an Fe-doped semi-insulating InP layer 3 formed by MOCVD, and subsequently an InGaAsP spacer layer 52 is selectively grown on the two sides of the SiO$_2$ film 51. In FIG. 18C, the SiO$_2$ mask 51 is removed, and a pair of stripes of an SiO$_2$ film 53 having a 12-μm wide opening are formed on the InGaAsP spacer layer 52.

Figure 18D:
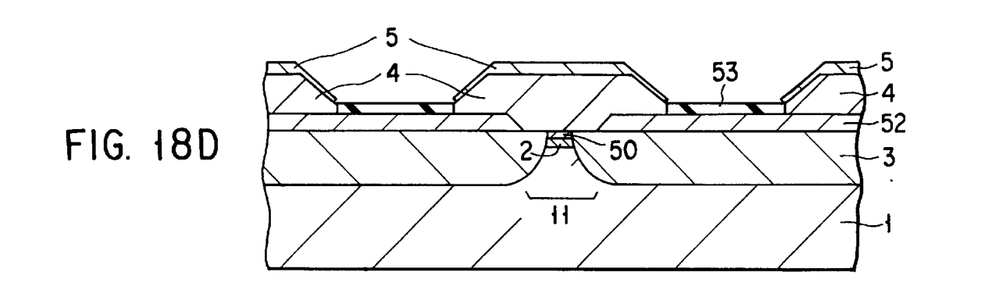
Figure 18E:
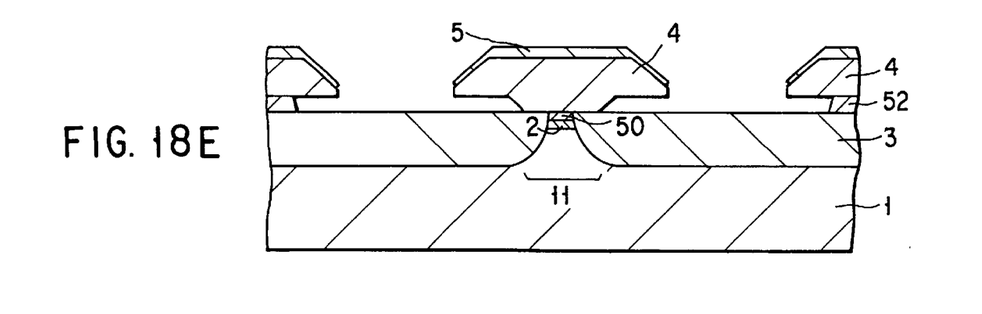

As shown in FIG. 18D, a p-type InP cladding layer 4 and a p-type InGaAs contact layer 5 are selectively grown by MOCVD by using the SiO$_2$ film 53 as a selective growth inhibiting mask. In FIG. 18E, the SiO$_2$ film 53 is removed and the InGaAsP spacer layer 52 is side-etched. Finally, an electrode formation step is performed to complete the optical semiconductor device with the structure illustrated in FIG. 17.

In this embodiment, the SiO$_2$ film 51 is used as a common mask when the mesa stripe 11 is formed by etching and the InGaAsP spacer layer 52 is selectively grown. Therefore, the position of the bottom surface of the p-type InP cladding layer 4 can be determined in self-alignment. Additionally, the width of the bottom surface of the p-type InP cladding layer 4 is determined by the width of the SiO$_2$ film 51 and is very small, e.g., 4 μm. This extremely decreases the element parasitic capacitance.

Also, the p-type InP cladding layer 4 has a sectional shape including the overhangs 4*a* (i.e., assumes a substantially T sectional shape). Consequently, the width of the upper surface of the p-type InP cladding layer 4 can be sufficiently increased although the width of the bottom surface of the p-type InP cladding layer 4 is small. Accordingly, the width of an p-type ohmic electrode 7 formed on the p-type InGaAs contact layer 5 is as large as 8 μm. The result is that it is possible to reduce the element parasitic capacitance and obtain a sufficiently low element series resistance at the same time.

Furthermore, the p-type InP cladding layer 4 and the p-type InGaAs contact layer 5 are previously formed into the shape of a stripe by selective growth. The side surfaces of the p-type InP cladding layer 4 formed by selective growth are relatively gentle inclined surfaces defined by (111) crystal planes. Therefore, when portions below the overhangs 4*a* of the p-type InP cladding layer 4 are buried with a dielectric film, an interconnecting line does not break on the side surfaces of the narrow mesa 12. Also, a step interconnection for connecting the p-type ohmic electrode to a bonding pad 9 can be easily formed.

In this embodiment, the portions below the overhangs 4*a* of the p-type InP cladding layer 4 are buried with the SiO$_2$ film 6 by using spin-on glass. The SiO$_2$ film 6 cracks if the film thickness is too large. In this embodiment, however, the SiO$_2$ film 6 does not crack because the gaps below the overhangs 4*a* of the p-type InP cladding layer 4 have a thickness of, e.g., 0.5 μm. Also, this gap thickness is determined by the thickness of the InGaAsP spacer layer 52 and highly controllable. Furthermore, since the dielectric film need not be made thick, it is unnecessary to use a polymer material such as a polyimide film and the reliability of the element also is high.

(Twelfth Embodiment)

Figure 19:
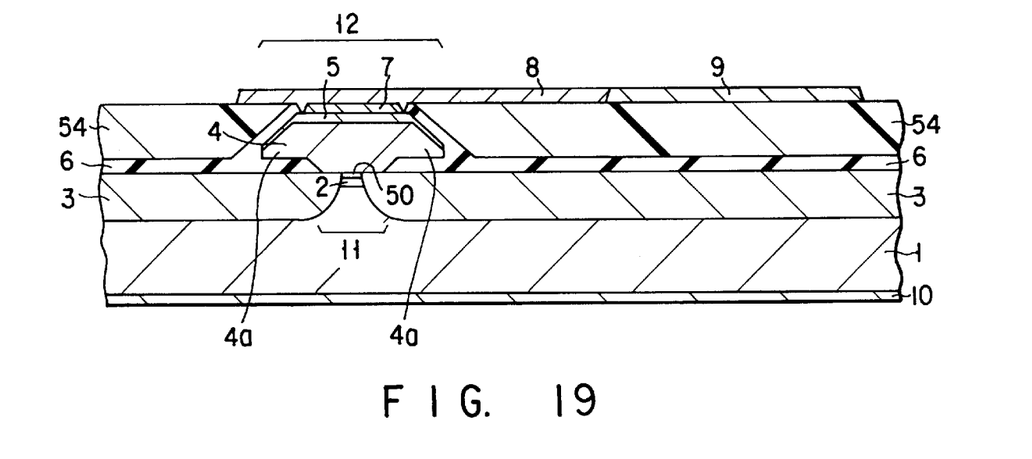
FIG. 19 is a sectional view in a plane perpendicular to the direction of propagation of an optical semiconductor device according to the twelfth embodiment of the present invention.

The twelfth embodiment of the present invention will be described below with reference to FIG. 19. FIG. 19 is a sectional view in a plane perpendicular to the direction of propagation of an optical semiconductor device according to the twelfth embodiment of the present invention. The same reference numerals as in FIG. 17 denote the same parts in FIG. 19 and a detailed description thereof will be omitted.

In this embodiment, a p-type InP cladding layer 4 and a p-type InGaAs contact layer 5 are selectively grown only in the region of a narrow mesa 12 by using a selective growth inhibiting mask having a single stripe opening. The side surfaces of the narrow mesa 12 are covered with an SiO$_2$ film 6 and buried with a polyimide film 54. This reduces the capacitance per unit area of a bonding pad 9. Since the side surfaces of the p-type InP cladding layer 4 and the p-type InGaAs contact layer 5 are relatively gentle inclined surfaces defined by (111) planes, the step of planarizing the element surface by using the polyimide film 54 can be readily performed. Also, as in the structure of the eleventh embodiment described above, the stripe p-type InP cladding layer 4 having a substantially T sectional shape makes it possible to reduce the element parasitic capacitance and obtain a sufficiently low element series resistance at the same time.

In this embodiment, a narrow mesa structure with a very high accuracy can be easily formed, and this realizes an optical semiconductor device capable of high-speed modulation using an electrical signal at a low cost.

The present invention is not limited to the above embodiments. Although the embodiments have been explained by taking InGaAsP-based semiconductor devices as examples, the present invention is applicable to other material systems such as AlGaInP-based, InGaAsSb-based, and ZnCdSSe-based material systems. Also, in each embodiment a contact layer is stacked on a cladding layer. However, if a sufficiently low contact resistance can be obtained between a cladding layer and an electrode metal, no contact layer needs to be stacked. Additionally, the embodiments have been explained by taking a single semiconductor modulator, a single semiconductor laser, and an integrated light source of an optical modulator and a semiconductor laser as examples. However, the present invention is also effective in a device structure fabricated by integrating, e.g., optical waveguides and optical amplifiers.

Furthermore, the conductivity type of a semiconductor buried layer is not restricted to a semi-insulating semiconductor layer. That is, a p-type semiconductor layer, an n-type semiconductor layer, or a stacked structure of these layers also can be used. Either a bulk material or a multiple quantum well structure can be used as an optical waveguide layer (active layer). A semiconductor buried layer is not limited to an InP layer. For example, it is possible to use an InGaAsP layer or a semiconductor layer formed by stacking an InP layer and an InGaAsP layer. The conductivity type or impurity concentration of a semiconductor buried layer can also be varied. A semiconductor substrate can be an off-substrate from a (100) crystal plane, and the conductivity type is not restricted to n-type. Moreover, the present invention can be practiced in the form of various modifications without departing from the spirit and scope of the invention.

In the present invention as has been described in detail above, a stripe cladding layer having a shape whose section is substantially trapezoidal and whose side surfaces are (111) crystal planes can be formed in an arbitrary position. Accordingly, it is possible to obtain a narrow mesa structure which has a high mesa width controllability and by which an electrode formation step is readily possible. As a consequence, an optical semiconductor device capable of high-speed modulation using an electrical signal can be realized without performing any difficult fabrication steps.

In addition, the two side surfaces of an optical waveguide layer are buried with a current blocking layer. Therefore, when this optical semiconductor device is used as an optical modulator, an electric field can be evenly applied to the optical waveguide layer and consequently a high extinction ratio can be obtained. On the other hand, when the optical semiconductor device is used as a semiconductor laser, it is possible to sufficiently reduce the leakage current and obtain a low-threshold operation and a high-output operation.

What is claimed is:

1. An optical semiconductor device comprising:

a semiconductor substrate having a mesa stripe in which at least an optical waveguide layer is formed, a major surface of said semiconductor substrate being a crystal plane:

a semi-insulating semiconductor buried layer formed on two side surfaces of said mesa stripe;

a stripe cladding layer formed on a mesa stripe region and said semiconductor buried layer and having a shape whose section is substantially trapezoidal and whose side surfaces are crystal planes; and a stripe current blocking layer formed between said semiconductor buried layer and said cladding layer.

2. A device according to claim 1, wherein a cladding layer having almost the same height as said stripe cladding layer formed on said mesa stripe is formed on said semiconductor buried layer so as to be separated from said stripe cladding layer.

3. A device according to claim 1, wherein said semiconductor buried layer is doped with Fe.

4. An optical semiconductor device comprising:

a semiconductor substrate having a mesa stripe in which at least an optical waveguide layer is formed, a major surface of said semiconductor substrate being a crystal plane:

a semiconductor buried layer formed on two side surfaces of said mesa stripe; and a stripe cladding layer formed on a mesa stripe region and said semiconductor buried layer, having a shape whose section is substantially trapezoidal and whose side surfaces are crystal planes, and having a flange portion wider than a surface in contact with at least said mesa stripe.

5. A device according to claim 4, wherein a cladding layer having almost the same height as said stripe cladding layer formed on said mesa stripe is formed on said semiconductor buried layer so as to be separated from said stripe cladding layer.

\* \* \* \* \*